(12) United States Patent
Arques

(10) Patent No.: US 9,172,894 B2
(45) Date of Patent: Oct. 27, 2015

(54) ELECTRONIC COMPONENTS MATRIX OF ENHANCED RELIABILITY AND METHOD FOR LOCATING A FAULT IN THE MATRIX

(75) Inventor: Marc Arques, Grenoble (FR)

(73) Assignees: COMMISSARIAT A L'ENERGIE ATOMIQUE ET AUX ENERGIE ALTERNATIVES, Paris (FR); TRIXELL, Moirans (FR)

( * ) Notice: Subject to any disclaimer, the term of this patent is extended or adjusted under 35 U.S.C. 154(b) by 272 days.

(21) Appl. No.: 13/982,414

(22) PCT Filed: Jan. 31, 2012

(86) PCT No.: PCT/EP2012/051591
§ 371 (c)(1),
(2), (4) Date: Sep. 12, 2013

(87) PCT Pub. No.: WO2012/104315
PCT Pub. Date: Aug. 9, 2012

(65) Prior Publication Data
US 2014/0368666 A1    Dec. 18, 2014

(30) Foreign Application Priority Data
Jan. 31, 2011   (FR) ...................................... 11 50737

(51) Int. Cl.
*H04N 17/00* (2006.01)
*H04N 17/02* (2006.01)
*H04N 5/374* (2011.01)
*H01L 27/146* (2006.01)
*H04N 5/367* (2011.01)
*H04N 5/3745* (2011.01)

(52) U.S. Cl.
CPC .......... *H04N 5/374* (2013.01); *H01L 27/14612* (2013.01); *H04N 5/367* (2013.01); *H04N 5/3745* (2013.01); *H04N 17/002* (2013.01)

(58) Field of Classification Search
USPC ......... 348/187, 246, 247, 285, 302, 307, 308, 348/309, 333.01, 523, 567, 710, 730, 733, 348/800; 257/88, 207, 209, 246, 292, 390, 257/443, 480, 578, 600, 691
See application file for complete search history.

(56) References Cited

U.S. PATENT DOCUMENTS

| 4,447,105 | A  | * | 5/1984  | Ruehl ........................... 439/489 |
| 8,130,304 | B2 | * | 3/2012  | Yin et al. ...................... 348/308 |
| 8,441,503 | B2 | * | 5/2013  | Isobe et al. .................... 345/690 |
| 8,754,974 | B2 | * | 6/2014  | Sekine .......................... 348/308 |
| 8,792,618 | B2 | * | 7/2014  | Mruthyunjaya et al. ..... 378/98.8 |
| 2007/0153502 | A1 | * | 7/2007  | Arriazu ......................... 362/152 |
| 2007/0176859 | A1 | * | 8/2007  | Cok et al. ....................... 345/76 |
| 2007/0216788 | A1 |   | 9/2007  | Korthout et al. |
| 2008/0258067 | A1 | * | 10/2008 | Vogtmeier et al. ....... 250/370.09 |

(Continued)

*Primary Examiner* — Jefferey Harold
*Assistant Examiner* — Mustafizur Rahman
(74) *Attorney, Agent, or Firm* — Baker & Hostetler LLP

(57) ABSTRACT

Enhancement of the reliability of an imaging device comprising several pixels is provided, each of the pixels comprising several first blocks of electronic components organized as a matrix and joined by links to row buses and column buses of the matrix allowing the powering and control of each of the first blocks for its nominal operation. Each of the pixels moreover comprises, associated with the first block, programmable means for disconnection of the first block from the at least one of the buses. Locating of a fault in a device is also provided, the fault occurring in one of the first blocks and leading to a generalized fault in several first blocks.

8 Claims, 5 Drawing Sheets

(56) References Cited

U.S. PATENT DOCUMENTS

2009/0173974 A1  7/2009  Shah et al.
2009/0231322 A1* 9/2009  Feng .............................. 345/213
2011/0211277 A1* 9/2011  Nishimoto et al. ............. 360/75
2011/0279013 A1* 11/2011 Pan et al. ....................... 313/497

* cited by examiner

ELECTRONIC COMPONENTS MATRIX OF ENHANCED RELIABILITY AND METHOD FOR LOCATING A FAULT IN THE MATRIX

CROSS-REFERENCE TO RELATED APPLICATIONS

This application is a National Stage of International patent application PCT/EP2012/051591, filed on Jan. 31, 2012, which claims priority to foreign French patent application No. FR 1150737, filed on Jan. 31, 2011, the disclosures of which are incorporated by reference in their entirety.

BACKGROUND OF THE INVENTION

The invention relates to the enhancing of the reliability of a matrix of electronic elements and to a method for locating a fault in the matrix. The invention is especially useful in imaging devices and more particularly in a detector allowing image capture.

This type of device comprises a great number of sensitive dots called pixels generally organized as a matrix or strip. In an image detector, a pixel is the basic sensitive element of the detector. Each pixel converts an incident signal to which it is subjected, such as for example electromagnetic radiation, into an electrical signal. The electrical signals issued by the various pixels of a matrix are collected in succession during a read-out phase so that they can be processed and stored to form an image. The signal from each pixel can be digitized either inside the pixel, in which case the pixel delivers digital information, or digitization can also be performed downstream of the pixel, the pixel then delivering analog information.

The pixels are for example made up of a photosensitive area delivering a current of electric charges as a function of the stream of photons it receives, and an electronic circuit for processing this current. The photosensitive area generally includes a photosensitive element, or photodetector, which can for example be a photodiode, a photoresistor or a phototransistor. The photodetector is connected to an electronic circuit inside the pixel, i.e. arranged upstream of a read bus, the latter being able to collect information from adjacent pixels. Generally, connection between the pixel and the read bus is controlled in such a way that the reading of each pixel is organized. Thus, the pixel comprises a photodetector as well as electronic elements arranged upstream of said connection. There exist photosensitive matrices of large dimensions which can possess several million pixels.

A radiation detector can be used for imaging ionizing radiation, and particularly X- or γ-radiation, in the medical field or in the area of non-destructive testing in the industrial field, for the detection of radiological images. Photosensitive elements make it possible to detect visible or near-visible electromagnetic radiation. These elements are insensitive, or poorly sensitive, to radiation incident on the detector. For this reason, use is often made of a radiation converter known as a scintillator, which converts incident radiation, for example an X-ray, into radiation in a band of wavelengths to which the photosensitive elements in the pixels are sensitive. An alternative consists in producing the photosensitive element from another material performing the direct conversion of the X-ray into electric charges. Such is the case, for example, of matrices in which a first pixellated substrate made of cadmium telluride (CdTe) is connected pixel-by-pixel to a CMOS read-out circuit, which therefore no longer has a detection function.

Each pixel is made up of a block of electronic components which can be relatively complex. This block is linked to arrays of rows and columns of the matrix. These rows and columns guarantee the necessary bias, the control, and the output paths for the information detected by the pixel.

Faults in a matrix may affect either the arrays of rows and columns (short-circuits or open circuits) or the inside of the blocks of electronic components.

The risk of failure of a block increases when so-called critical components are incorporated into the pixel, i.e. components having a higher risk of failure than more standard components. These could be, for example, components making use of certain particular technological processes, or employing particular surfaces: for example, a high-capacitance capacitor can employ thin dielectric films, which may present local defects, or even be of large area, in which case it then runs the risk of being affected by dust during fabrication. Naturally, by increasing the number of pixels, the risk of a pixel failure increases.

To reduce this risk, it is possible to design components or connections inside the blocks with margins of safety over the minimum design rules. However, this limits the number of acceptable components per pixel and therefore the achievable operations.

One can nonetheless tolerate failures in isolated pixels. For example in an image detector, when a pixel is faulty, it is possible to reconstruct the missing information by averaging the items of information issued by neighbouring pixels.

However, failure in an isolated pixel, for example a short circuit, can pollute neighbouring pixels of a row or column, or even prevent the overall operation of the matrix.

To avoid this contagion efforts have been made to locate the defective pixels in order to isolate them by cutting the connections linking the affected blocks to the row or column buses, generally by laser fire. However, this technique has several limitations.

It is an additional technological step, requiring equipment and time, and therefore incurring a cost.

The use of laser fire presupposes knowledge of the position of the faulty pixel. However, in the case where the fault triggers the breakdown of a power supply, the fault before correction can trigger loss of functionality of a large part of the matrix, or even the entire matrix. Location is then difficult or impossible.

The use of laser fire requires the provision of spaces dedicated to laser cutting. This therefore takes up space in the pixels.

Laser fire can be used in the factory, but in practise is not feasible after-sale. It cannot therefore be used to combat faults appearing during the lifetime of the device.

As an alternative to laser fire, fuses incorporated into each pixel may be used. The limitations are broadly the same as for laser fire.

SUMMARY OF THE INVENTION

The invention aims to palliate all or some of the problems mentioned above by providing a device comprising several blocks of electronic components, these blocks being organized as a matrix, in which device the independent disconnection of each of the blocks can be programmed.

For this purpose, one subject of the invention is an electronic imaging device comprising several pixels, each of the pixels comprising a first block of electronic components organized as a matrix and joined by links to row buses and column buses of the matrix allowing powering and control of each of the first blocks for its nominal operation, characterized in that each of the pixels moreover comprises, associated with the first block, programmable means for disconnection of the first block from at least one of the buses and in that each of the programmable means for disconnection comprises a second block of programmable electronic components and at least one switch, piloted by the second block and making it possible to isolate the first associated block from the at least one of the buses.

Another subject of the invention is a method for locating a fault in a device according to the invention, the fault occurring in one of the first blocks and leading to a generalized fault in several first blocks, the method being characterized in that it consists in:
- disconnecting all the first blocks affected by the generalized fault,
- reconnecting the first disconnected blocks until the appearance of the generalized fault,
- identifying the faulty block among those which once reconnected have made the generalized fault appear.

BRIEF DESCRIPTION OF THE DRAWINGS

The invention will be better understood and other advantages will become apparent on reading the detailed description of an embodiment given by way of example, which description is illustrated by the attached drawings, in which.

For the sake of clarity, the same elements have been given the same identifiers in the various figures.

DETAILED DESCRIPTION

Figure 1:
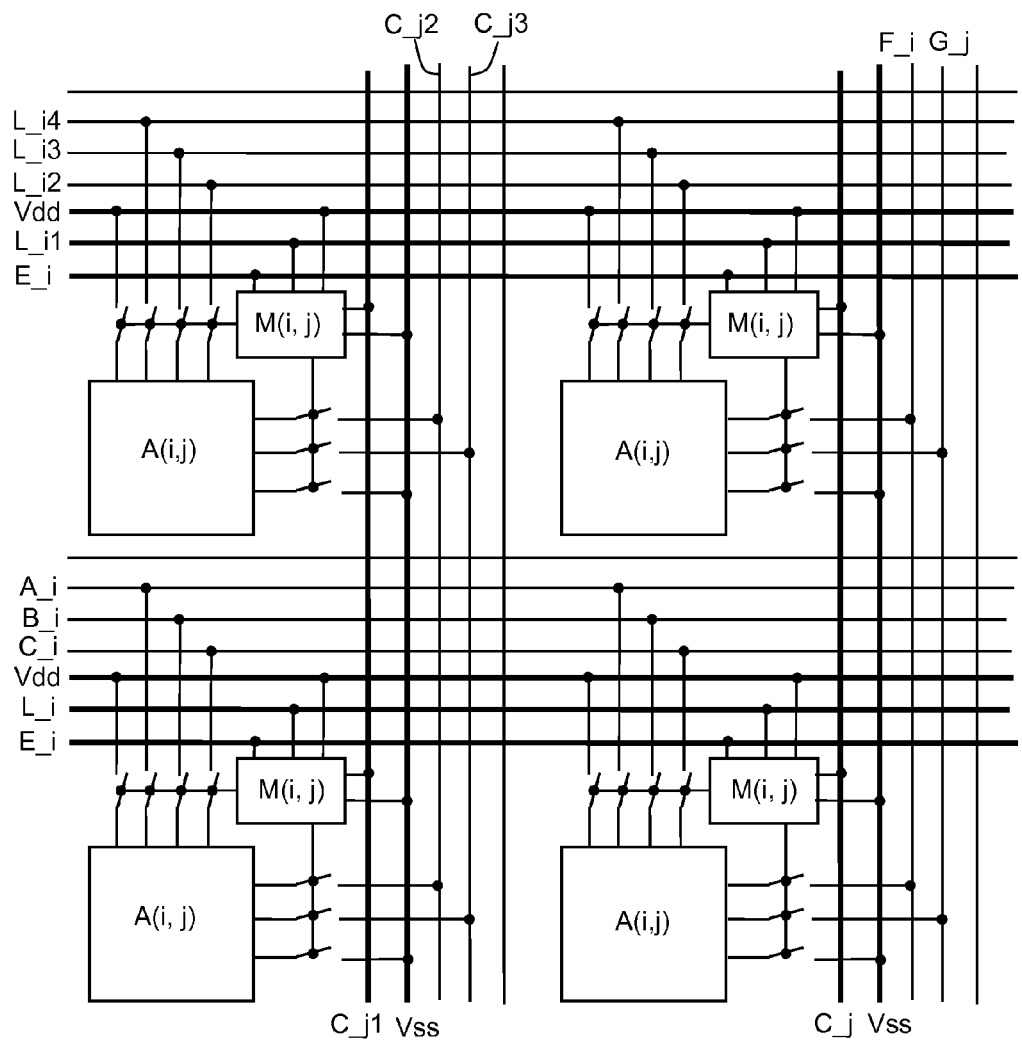
FIG. 1 shows a diagram of an electronic device according to the invention and comprising several first blocks of electronic components organized as a matrix and programmable means for disconnection of the first block.

FIG. 1 shows a diagram of an electronic device formed by a matrix of two rows and two columns for ease of understanding. Four pixels, advantageously identical, are formed, each at the intersection of a row and a column. Of course, real matrices are generally much larger. Each pixel comprises a block $A(i,j)$ of electronic components capable of carrying out the nominal operation of the pixel. $(i,j)$ represent the coordinates of the pixel in the matrix, i for the row and j for the column. For example when the device is an image detector, each of the pixels comprises photosensitive elements capable of generating an electrical signal as a function of the electromagnetic radiation to which it is subjected. In a more general way, the expression "nominal operation" is understood to mean the operation that the electronic component block performs when undisturbed by faults.

In order to operate, each of the blocks $A(i,j)$ requires electric power supplies, which can be common to all the blocks $A(i,j)$, for example a positive power supply Vdd and a negative or ground supply Vss. The power supplies may be delivered either by row buses, column buses, or by gates. In FIG. 1, the example has been chosen of a supply voltage Vdd delivered by a row bus and of a supply voltage Vss delivered by a column bus. In operation, each of the blocks $A(i,j)$ may require other buses, for example for its selection, for gathering information, or again for certain controls, such as a reset to zero or phase selection, such as the acquisition or reading of the pixel. FIG. 1 shows, by way of example, three row buses $L\_i2$, $L\_i3$ and $L\_i4$, and two column buses $C\_j2$ and $C\_j3$ used by each of the blocks $A(i,j)$. The number of buses depends on the complexity of each of the blocks $A(i,j)$. The term bus denotes an electrical conductor.

According to the invention, each pixel comprises programmable means for disconnection of the block from at least one of the buses. These means comprise a second block $M(i,j)$ of programmable electronic components associated with each of the first blocks $A(i,j)$. The device comprises at least one bus intended to address, in the matrix, the programmable means for disconnection and a bus intended to program the programmable means for disconnection. More precisely, each of the blocks $M(i,j)$ is linked to a row bus $L\_i1$ and a column bus $C\_j1$ allowing it to be addressed. Each of the blocks $M(i,j)$ is also linked to a row bus $E\_i$ allowing it to be programmed. Alternatively, this programming could be achieved by means of a column bus. Each of the programmable blocks $M(i,j)$ makes it possible to disconnect the associated block $A(i,j)$ from the various buses to which it is linked during its nominal operation. Specifically, inside each pixel, each connection between the block $A(i,j)$ and one of the buses with which the block $A(i,j)$ is linked may be broken by a switch controlled by the associated block $M(i,j)$. In other words, the blocks $M(i,j)$ pilot the switches, making it possible to isolate the blocks $A(i,j)$ from the rest of the matrix.

The blocks $M(i,j)$ and the buses that allow their operation make up elements for controlling the operation of the matrix. They make it possible to tolerate faults in the blocks $A(i,j)$, but they must not themselves contain faults, or as few as possible in any case. The implementation of the invention requires the introduction of the blocks $M(i,j)$ and of several buses for addressing and programming. These additions only present a real benefit if the blocks $A(i,j)$ are notably more complex than the blocks $M(i,j)$, which must therefore be produced with the best design rules possible: large and well-spaced components. In other words, the blocks $M(i,j)$ must be notably more reliable than the blocks $A(i,j)$. This reliability can be determined by the mean time between two failures (MTBF or "mean time between failures").

It is desirable that the assembly made up of the blocks $M(i,j)$ and the buses to which they are linked be the most secure possible, i.e. it must be minimal and as independent as possible from the blocks $A(i,j)$ and from their controls. Nonetheless, compromises must sometimes be made, and, for example, the row buses which allow the blocks $A(i,j)$ to be addressed can sometimes be fused with those that select the blocks $M(i,j)$.

The same applies for the voltage supplies to the blocks $A(i,j)$ and $M(i,j)$. In the example shown, the blocks $A(i,j)$ and $M(i,j)$ are linked to the same voltage supply buses Vdd and Vss. It is perfectly possible to separate the voltage supply buses of the blocks $A(i,j)$ from the voltage supply buses of the blocks $M(i,j)$ in order to improve the independence of the blocks $M(i,j)$.

To produce the most simple block $M(i,j)$ possible, it is desirable that the programming be the most simple possible, if possible reduced to one single item of binary information. As a consequence, if the block $M(i,j)$ must be able to disconnect the affected block $A(i,j)$ from several buses, the control of the set of the switches allowing these disconnections is single. During the use of a block $M(i,j)$, it will not be possible to choose among the buses to disconnect.

In contrast, during design of the device, it is possible to choose those links between the block A(i,j) and the buses to which it is connected, which it is desired to break. It is for example possible to place a single switch between the block A(i,j) and the bus carrying the voltage Vdd. In other words, the programmable means allow only the disconnection of the positive power supply Vdd. This solution makes it possible to simplify to a maximum the programmable means for disconnection and is suitable if the design of the blocks A(i,j) causes the links to the other buses to tend toward a ground potential when the block A(i,j) under consideration is no longer linked to its voltage Vdd.

In contrast, an interruption of the power supply Vdd can lead to random drifts on the other buses. In this case, it is preferable to provide for the complete isolation of the block A(i,j). In other words, the programmable means allow the disconnection of all the buses intended for the nominal operation of the block A(i,j) under consideration.

For a photosensitive matrix, an acquisition phase, a read-out phase and a reset to zero phase are generally carried out sequentially. The blocks M(i,j) are programmed in a dedicated phase separate from the other phases of nominal operation of the device. Outside this programming phase, the blocks M(i,j) retain in their memory the order to isolate the associated blocks A(i,j) and can bias in a static manner the controls of the switches. They can therefore be designed with low energy consumption or speed constraints.

A fault on one block A(i,j) can lead to the breakdown of the power supplies of several blocks A(i,j), such as, for example, all the blocks A(i,j) of a row or of a column or even all the blocks A(i,j) of the matrix. The faulty block A(i,j) is difficult to locate in the prior art. By implementing the programmable means for disconnection according to the invention, it becomes possible to locate this fault.

A method for locating a fault occurring in a block A(i,j) and leading to a generalized fault over several blocks A(i,j) consists first of all in disconnecting all the blocks A(i,j) affected by the generalized fault. This disconnection may be done on the affected row or column or again over the whole matrix. Next, the disconnected blocks A(i,j) are reconnected until the appearance of the generalized fault in order to identify the faulty block A(i,j) that has made the generalized fault appear. In other words, in the imaging device, a fault on one pixel can propagate to several other neighbouring pixels. The method for locating the fault consists in disconnecting all the pixels affected by the fault, then in reconnecting the disconnected pixels until the appearance of the generalized fault, in order to identify the faulty pixel that has made the generalized fault appear.

The reconnection of the disconnected blocks A(i,j) can be done one by one until the appearance of the generalized fault. The block A(i,j) is then identified as being the last reconnected block A(i,j) that has made the generalized fault appear.

Alternatively, it is possible to proceed by dichotomy. More precisely, the disconnected blocks are reconnected by sub-set. For example, it is possible to define two sub-sets of cardinal number roughly half the cardinal number of the set containing the initially disconnected blocks A(i,j). Next, the sub-set making the generalized fault appear is identified. Next, the first step of the method is repeated, but disconnecting only the blocks of the identified sub-set, and once more following the sequence of steps of the method by sub-set, reducing the cardinal number of the sub-sets until identification of the faulty block A(i,j). The method for this alternative is more complex to implement but makes it possible to arrive at the identification of the faulty block A(i,j) more rapidly.

Figure 2:
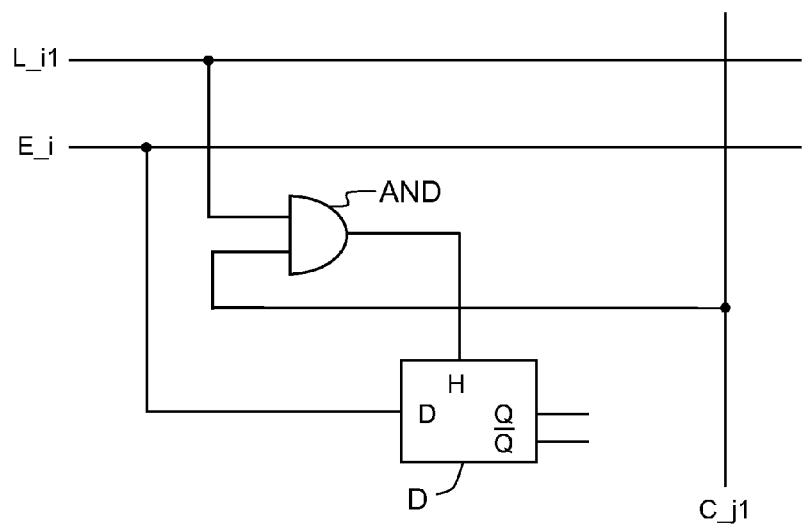
FIG. 2 shows a diagram of an example second block of electronic components belonging to the programmable means for disconnection.

FIG. 2 shows a diagram of an example of a block M(i,j), comprising means for carrying out its addressing in the matrix and means for piloting the switches allowing the disconnection of the associated block A(i,j) from the various buses to which it is linked. In this example, the block M(i,j) comprises an AND gate and a flip-flop D. The two inputs of the AND gate are linked to the two buses L_i1 and C_j1. The AND gate performs a logical "AND" operation on the items of logic information conveyed on the row bus L_i1 and the column bus C_j1 in order to address the block M(i,j). The output of the AND gate is linked to the clock input of the flip-flop D. The input D of the flip-flop D is linked to the bus E_i, in order to receive the control command to disconnect the associated block A(i,j). The outputs Q or $\overline{Q}$ of the flip-flop D pilot the switches, making it possible to isolate the block A(i,j) from the rest of the matrix.

Figure 3:
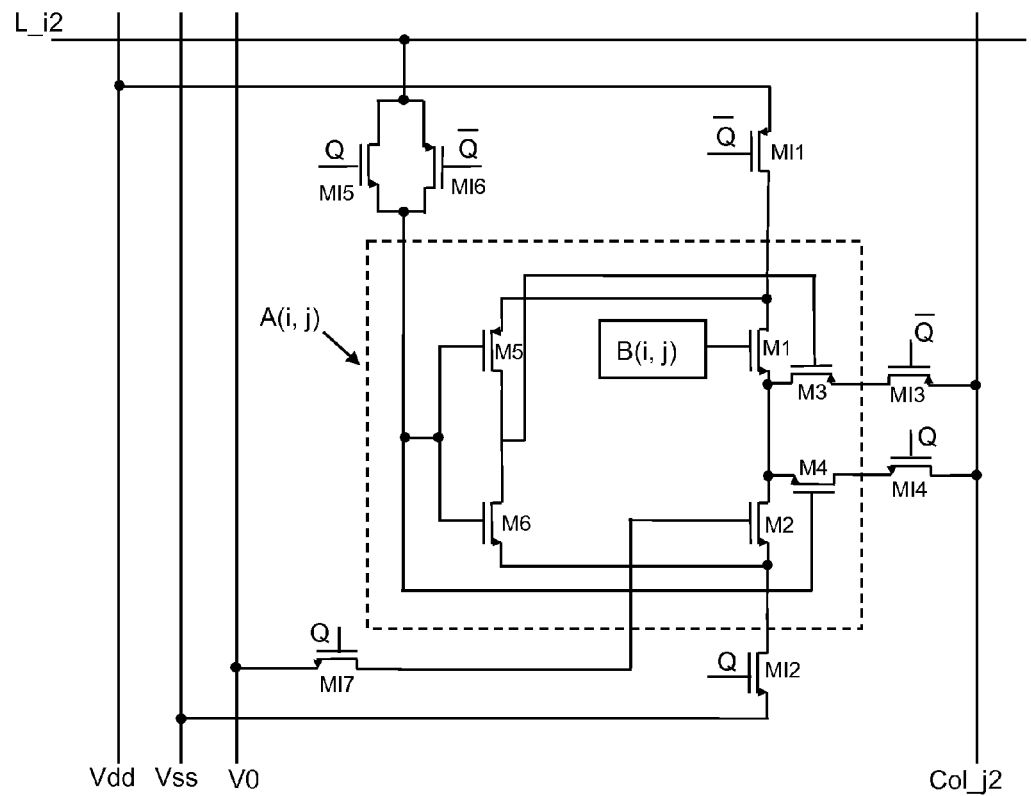
FIG. 3 shows a diagram of an example first block associated with electronic switches controlled by a second block.

FIG. 3 shows a diagram of an example block A(i,j) associated with electronic switches allowing it to be disconnected from the buses of the matrix. In this example, the block A(i,j) contains:

A sub-block B(i,j), not detailed, supplying voltage information. When the device is an image detector, the voltage information is for example a voltage proportional to an illumination received by the pixel. It is of course possible to transpose the diagram in FIG. 2 to a pixel delivering digital items of information on a bus, or a series of digital, analog, or mixed items of information on a series of output buses.

A voltage follower stage composed of two NMOS type transistors, M1 and M2, the gate of the transistor M2 being linked to a fixed voltage V0, so that the transistor M2 operates as a current source. The voltage V0 is here delivered by a column bus.

A double switch of PMOS M3 and NMOS M4 type linking the column bus Col_j2 with a point common to the two transistors M1 and M2 forming the output of the preceding follower stage. The switch M4 is in the on-state when the row bus L_i2 is activated at high logic.

An inverter composed of two transistors of NMOS M6 and PMOS M5 type. This inverter makes it possible to produce in the block A(i, j) an inverted control for the switch M3 allowing it to be turned on at the same time as the switch M4.

According to the invention, a switch, piloted by the block M(i,j) shown in FIG. 2, is placed between each output of the block A(i,j) and the row or column buses to which these outputs are connected. Thus are added:

A switch MI2 of NMOS type, in a link linking the source of the transistor M2 to the bus carrying the potential Vss.

A switch MI4 of NMOS type, in a link linking the drain of the transistor M4 to the column bus Col_j2.

A switch MI7 of NMOS type, in a link linking the gate of the transistor M2 to the column bus carrying the voltage V0.

A switch MI1 of PMOS type, in a link linking the drain of the transistor M1 to the potential Vdd.

A switch MI3 of PMOS type, in a link linking the source of the transistor M3 to the column Col_j2.

A double switch of the NMOS type MI5 and PMOS type MI6 linking the gates of the transistors M4, M5 and M6 to the column bus L_i2.

The transistors of NMOS type are piloted by the output Q of the block M(i,j) as shown in FIG. 2 for example. The transistors of PMOS type are piloted by the output $\overline{Q}$ of the same block M(i,j).

The choice between switches of NMOS and PMOS type is made depending on the voltage levels of the links on which these switches are placed. Transistors of NMOS type are suitable for low potentials and are in the on-state when their gate is at a high level. In contrast, transistors of PMOS type are suitable for high potentials and are in the on-state when their gate is at a low level. The double switches, of NMOS and PMOS type, can let both high and low potentials through at once.

It should be remembered that a transistor of NMOS type is an IG-FET transistor of the negative type and that a transistor of PMOS type is an IG-FET transistor of the positive type.

Figure 4:
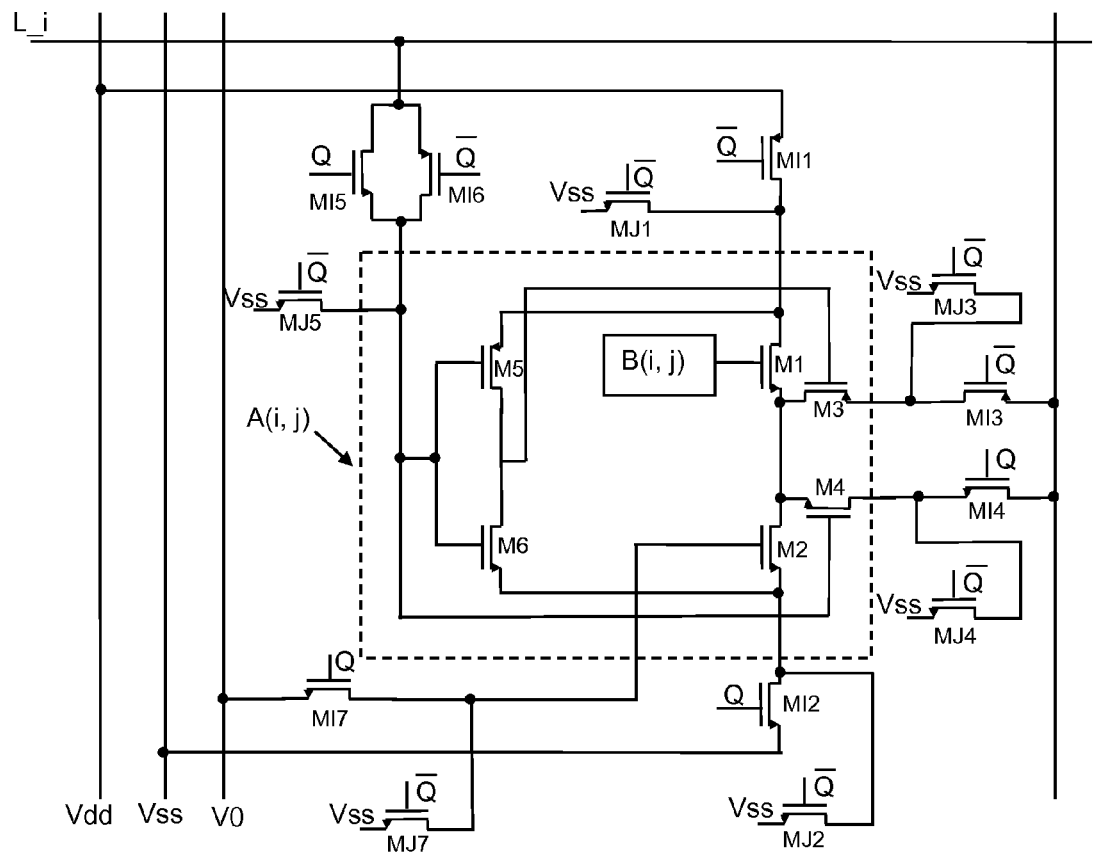
FIG. 4 shows a diagram of a first variant of the first block in FIG. 3.

FIG. 4 shows a diagram of a first variant of the block A(i,j) shown previously. In the example in FIG. 3, if a block A(i,j) is faulty, the set of the switches linking it to the row and column buses are set to the off-state. The block A(i,j) is then left floating, avoidance of which would be desirable in order to control all the voltages in the device.

To avoid the block A(i,j) being left floating, the device comprises, associated with each block A(i,j), programmable means for reconnection of the disconnected link(s) to a fixed voltage. To this end, one can join to each switch MI1 to MI7 one switch, piloted in phase opposition, and connecting the output link of the block A(i,j) which would have been left floating, to a fixed voltage, for example the voltage Vss. Another choice of voltage is of course possible.

In FIG. 4, six switches of NMOS type MJ1, MJ2, MJ3, MJ4, MJ5 and MJ7 have been added. These switches being of N type, and connecting the output links of the block A(i,j) to the voltage Vss, their gate control is therefore $\overline{Q}$. However, it is of course possible to transpose this to a diagram using switches of PMOS type, controlled by the output Q, by connecting the output links of the blocks A(i,j) to a higher voltage than Vss.

Figure 5:
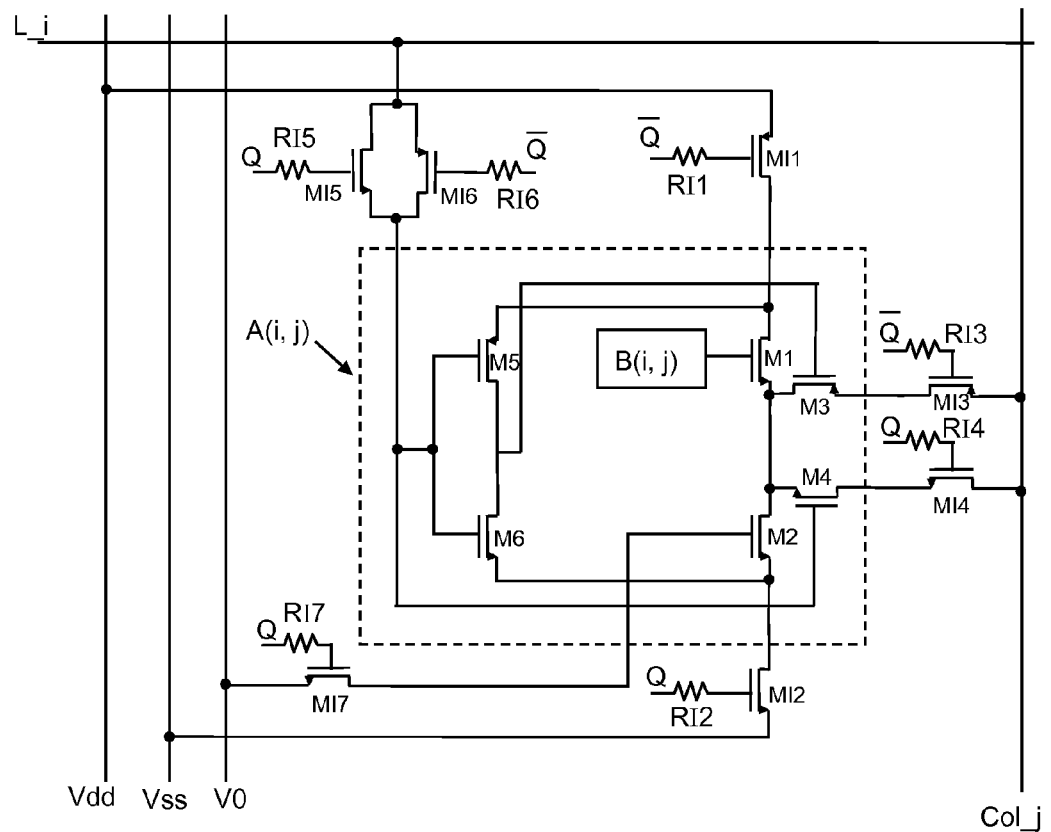
FIG. 5 shows a diagram of a second variant of the first block in FIG. 3.

FIG. 5 shows a diagram of a second variant of the block A(i,j) shown previously. This variant makes it possible to palliate any possible failures of the programmable means for disconnection of the block A(i,j).

As has been seen above, the blocks M(i,j) and the buses that pilot them must be produced with the best design rules to improve the reliability of these elements. Another fault risk affects the switches, MIx or MJx, x representing the numerical part of the identifier of the affected switch. In particular, there may be an electrical leakage (or short circuit) between their gate and their source or their drain. Such a fault will firstly make the blocks M(i,j) consume power when they are only a priori provided to bias the transistor gates without any power consumption, and secondly may inject a current into output buses of the block A(i,j), the bus Col_j1 for example, and therefore pollute the information from neighbouring pixels.

To avoid that, it will be noted that the switches MIx or MJx are always biased in a static manner, in the on-state or off-state, except during the programming phase which can be much longer than the normal read time of the matrix.

It is therefore possible to insert in series high-value resistors RIx, of the order of several kiloOhms for example, between the outputs Q and $\overline{Q}$ of the blocks A(i,j) and the gates of the switches MIx. To avoid crowding FIG. 5 the switches Mjx have not been shown, but a resistor RJx can be just as well placed in series in the control of each switch Mjx.

When the switches Mix and MJx operate normally, the series resistors Rix and RJx do not play any part, and in particular do not interfere with the operation of the device since no current crosses them.

If a switch Mix or MJx is defective, the corresponding series resistor Rix or RJx will limit the current delivered by the block M(i,j), thereby avoiding the breakdown of the power supply of the block M(i,j) connected to the defective switch, and therefore the propagation of the fault to neighbouring pixels.

In the same way, the series resistor Rix or RJx will limit the leakage current delivered on the output buses (L_ix or Col_jx) for example, and the biases originating from the matrix edges, for the bus L_i1 for example, or from other pixels, Col_j1 for example, making withstand of the disturbance possible.

The invention claimed is:

1. An electronic imaging device comprising several pixels, each of the pixels comprising a first block of electronic components organized as a matrix and joined by links to row buses and column buses of the matrix allowing the powering and control of each of the first blocks for its nominal operation comprising an acquisition phase, a read-out phase and a reset to zero phase, each of the pixels further comprising, associated with the first block, programmable means of disconnection of the first block from at least one of the buses, each of the programmable means for disconnection comprising a second block of programmable electronic components and at least one switch, piloted by the second block and making it possible to isolate the first associated block from the at least one of the buses, wherein the second block is intended to be programmed outside of the nominal operation to retain the order to isolate the first associated block in the device memory.

2. The device as claimed in claim 1, further comprising at least one bus intended to address in the matrix the programmable means for disconnection and one bus intended to program the programmable means for disconnection.

3. The device as claimed in claim 1, wherein the first blocks are powered by a positive supply voltage and a negative supply voltage, the supply voltages being common to all the first blocks, and in that wherein the programmable means allow only disconnection of the positive supply voltage.

4. The device as claimed in claim 1, wherein the programmable means allow disconnection of all the buses intended for the operation of the first block under consideration.

5. The device as claimed in claim 1, further comprising associated with each first block programmable means for reconnection of the disconnected links or links to a fixed voltage.

6. A method for locating a fault in the device as claimed in claim 1, the fault occurring in one of the first blocks and leading to a generalized fault in several first, the method comprising: disconnecting all the first blocks affected by the generalized fault, reconnecting the first disconnected blocks until the appearance of the generalized fault, and identifying the faulty block among those which once reconnected have made the generalized fault appear.

7. The method as claimed in claim 6, further comprising:
reconnecting one by one the first disconnected blocks until the appearance of the generalized fault, and
identifying the faulty block as being the last reconnected block that has made the generalized fault appear.

8. The method as claimed in claim 6, further comprising:
reconnecting the disconnected blocks by sub-set,
identifying the sub-set that has made the generalized fault appear,
repeating the first step of the method, disconnecting only the blocks of the identified sub-set, and
repeating again the subsequent steps of the method by sub-set, reducing the cardinal number of the sub-sets until identification of the faulty block.

* * * * *

UNITED STATES PATENT AND TRADEMARK OFFICE
CERTIFICATE OF CORRECTION

| | |
|---|---|
| PATENT NO. | : 9,172,894 B2 |
| APPLICATION NO. | : 13/982414 |
| DATED | : October 27, 2015 |
| INVENTOR(S) | : Marc Arques |

It is certified that error appears in the above-identified patent and that said Letters Patent is hereby corrected as shown below:

Title Page, Item (73) In the Assignee information:

Please replace "COMMISSARIAT A L'ENERGIE ATOMIQUE ET AUX ENERGIE ALTERNATIVES" with --COMMISSARIAT A L'ENERGIE ATOMIQUE ET AUX ENERGIES ALTERNATIVES--.

In the claims:

Column 8, In line 35, Approximately of claim 3, please replace "and in that wherein" with --and wherein--.

Signed and Sealed this
Twenty-second Day of March, 2016

Michelle K. Lee
*Director of the United States Patent and Trademark Office*